(12) United States Patent
Reid et al.

(10) Patent No.: US 6,958,123 B2
(45) Date of Patent: Oct. 25, 2005

(54) METHOD FOR REMOVING A SACRIFICIAL MATERIAL WITH A COMPRESSED FLUID

(75) Inventors: Jason S. Reid, Los Gatos, CA (US); Nungavaram S. Viswanathan, San Jose, CA (US)

(73) Assignee: Reflectivity, INC, Sunnyvale, CA (US)

( * ) Notice: Subject to any disclaimer, the term of this patent is extended or adjusted under 35 U.S.C. 154(b) by 332 days.

(21) Appl. No.: 10/167,272

(22) Filed: Jun. 10, 2002

(65) Prior Publication Data

US 2003/0047533 A1 Mar. 13, 2003

Related U.S. Application Data

(60) Provisional application No. 60/298,529, filed on Jun. 15, 2001.

(51) Int. Cl.[7] .............................. C23F 1/00; H01L 21/00
(52) U.S. Cl. .............................. 216/2; 216/13; 216/27; 216/40; 216/56; 216/92; 438/48
(58) Field of Search ............................... 216/2, 13, 27, 216/49, 56, 92, 40; 438/48

(56) References Cited

U.S. PATENT DOCUMENTS

| | | |
|---|---|---|
| 5,212,229 A | 5/1993 | Taylor et al. |
| 5,281,690 A | 1/1994 | Flaim et al. |
| 5,454,906 A | 10/1995 | Baker et al. |
| 5,868,862 A | 2/1999 | Douglas et al. |
| 5,888,591 A | 3/1999 | Gleason et al. |
| 5,908,995 A | 6/1999 | Pauchon et al. |
| 5,922,833 A | 7/1999 | DeSimone |
| 5,981,673 A | 11/1999 | DeSimone et al. |
| 5,993,747 A | 11/1999 | Mandel |
| 6,024,801 A | 2/2000 | Wallace et al. |
| 6,045,877 A | 4/2000 | Gleason et al. |
| 6,067,728 A | 5/2000 | Farmer et al. |
| 6,096,460 A | 8/2000 | French et al. |

(Continued)

FOREIGN PATENT DOCUMENTS

| | | |
|---|---|---|
| WO | WO-99/04911 A1 | 2/1999 |
| WO | WO-00/17712 A1 | 3/2000 |
| WO | WO-00/27544 A1 | 5/2000 |
| WO | WO00/67072 | 11/2000 |
| WO | WO-00/68170 A1 | 11/2000 |

OTHER PUBLICATIONS

Denhoff et al., "Fabrication of a MEMS Microwave Switch", Canadian Workshop on MEMS (CWMEMS'99), Ottawa, Canada (Aug. 13, 1999) (abstract only).
Hornbeck, L.J., "Digital Light Processing (TM) for High–Brightness, High–Resolution Applications", white paper from Texas Instruments (1997).
Ito, H., "Chemically Amplified Resists: Past, Present, and Future", invited paper from the SPIE Conference on Advances in Resist Technology publication date unknown.
Liberova et al., "64×64 Bolometer–Type Uncooled Infrared Detector", Physical, Chemical, and Biological Sensors (IWRFRI'2000), St. Petersburg, Russia (May 29–31, 2000) (abstract only).
Shearwood et al., "Micromachined Rotating Gyroscope", from the website of the School of Electrical Engineering and Computer Science at Seoul National University, Korea publication date unknown; accessed and printed on Feb. 9, 2001.

(Continued)

*Primary Examiner*—George A. Goudreau
(74) *Attorney, Agent, or Firm*—Gregory R. Muir

(57) ABSTRACT

A method comprises depositing an organic material on a substrate; depositing additional material different from the organic material after depositing the organic material; and removing the organic material with a compressed fluid. Also disclosed is a method comprising: providing an organic layer on a substrate; after providing the organic layer, providing one or more layers of a material different than the organic material of the organic layer; removing the organic layer with a compressed fluid; and providing an anti-stiction agent with a compressed fluid to material remaining after removal of the organic layer.

122 Claims, 7 Drawing Sheets

U.S. PATENT DOCUMENTS

| | | | |
|---|---|---|---|
| 6,103,447 | A | 8/2000 | Chen et al. |
| 6,149,828 | A | 11/2000 | Vaartstra |
| 6,153,269 | A | 11/2000 | Gleason et al. |
| 6,156,435 | A | 12/2000 | Gleason et al. |
| 6,156,933 | A | 12/2000 | Poliakoff |
| 6,165,559 | A | 12/2000 | McClain et al. |
| 6,165,560 | A | 12/2000 | McClain et al. |
| 6,174,631 | B1 | 1/2001 | French et al. |
| 6,200,637 | B1 | 3/2001 | McClain et al. |
| 6,306,754 | B1 * | 10/2001 | Agarwal ............... 438/619 |
| 6,346,030 | B1 * | 2/2002 | Morales ................. 451/28 |
| 6,346,484 | B1 * | 2/2002 | Cotte et al. ............ 438/725 |
| 6,362,083 | B1 * | 3/2002 | Mueller-Fiedler et al. .. 438/570 |
| 6,502,306 | B2 * | 1/2003 | Silverbrook ........... 29/890.1 |
| 6,656,666 | B2 * | 12/2003 | Simons et al. ......... 430/322 |
| 6,753,037 | B2 * | 6/2004 | Miller et al. ........... 427/240 |
| 2002/0012884 | A1 | 1/2002 | Gleason et al. |
| 2003/0150559 | A1 * | 8/2003 | Biberger et al. ....... 156/345.11 |
| 2003/0181343 | A1 * | 9/2003 | Davenhall et al. ........ 510/175 |

OTHER PUBLICATIONS

Sun et al., "A Bistable Microrelay Based on Two–Segment Multimorph Cantilever Actuators", 11th Annual International Workshop on Micro Electro Mechanical Systems, Heidelberg, Germany (Jan. 25–29, 1998).

Young, D., "Voltage–Controlled Oscillator with Micromachining–Based Tunable Band Filter", project description from the University of California at Berkeley (1995).

AlliedSignal, FLARE Product Bulletin, Allied Microelectronic Materials web site.

AlliedSignal, Spin–On Versus CVD Challenge Answered by Advanced Low K Solution for Sub 0.18–Micron Chips, Dec. 2, 1998, Business Wire News Release.

Carbonell, Coating Applications from Liquid and Supercritical Carbon Dioxide, Aug. 25, 2000, Applied Mathematics Seminar Schedule (Abstract only).

Caulfield, Optimization of CVD Film Properties Through the4 Use of Dual Precursors, Colorado State Univesity. (abstract only).

Chiarello, Multidisplinary Approaches Target ES&H, Feb. 1999, Cahners Semiconductor International.

Clarke, Compatibility of Common Fluoropolymers with Various Photochemical Solvents, Millipore Microelectronics Applications Notes.

Corbett, Tipping the Scales for Spin–On vs. CVD, Sep. 2000, vol. 1, No. 9, Semi Conductor Magazine.

Crawford, Materials Design of Novel Fluoropolymers for 157 nm Photoresists and Pellicles, Dupont Central Research, E356–384, Wilmington, DE 19880–0356.

De Boer, Adhesion of Polysilicon Microbeams in Controlled Humidity Ambients, 1996, Proceedings of the 1998 MRS Spring Symposium, San Francisco, CA (Abstract only).

Dixon, Supercritical Fluids, South Dakota School of Mines & Technology.

Dow Chemical, SiLK Product Overview, Dow Chemical Web Page.

Dow Chemical, SiLK I Semiconductor Dielectric, Typical Properties.

Dow Chemical, AP4000 Adhesion Promoter, Typical Properties.

Dyck, Supercritical Carbon Dioxide Solvent Extraction from Surface–Micromachined Micromechanical Structures, Oct. 1996, SPIE Micromachining and Microfabrication.

French, Fluoropolymers for 157nm Lithography: Optical Properties from VUV Absorbance and Ellipsometry Measurements, I. Dupont Co., Central Research, E356–384, Wilmington DE.

Hardin, Consensus Builds Behind 157–nm Microlithography, Feb. 2000, No. 194, OE Reports, The International Society for Optical Engineering.

Henke, Simulation for DUV–Lithography, Sep. 11, 1996, Lithography Resource Semiconductor Fabtech–onwife, website of Fabtech.org.

Hoggan, Spin Coating and Photolithography Using Liquid and Supercritical Carbon Dioxde, 20000, [117b]. AIChE 2000 Annual Meeting.

Interconnect Dielectrics, FLARE Product Bulletin.

Ito, Chemical Amplification Resists: History and Development within IBM, Feb. 9, 1996, vol. 41, No. 1/2, IBM Journal of Research & Development.

Ito, Chemically Amplified Resists, Past, Present, and Future, Part of the SPIE Conference on Advances in Resist Technology.

Jafri, Critical Point Drying and Cleaning for MEMS Technology, Sep. 1999, Proceedings of the International Society for Optical Engineering (Abstract only).

Jakatdar, Physical Modeling of Deprotection Induced Thickness Loss, University of California, Berkeley, CA.

Kho, Thermodynamic Properties and Solvent Strength of Carbon Dioxide–Expanded Fluorinated Solvents (77f)— 2000, AIChE 2000 Annual Meeting, Supercritical Fluids Research Papers (Abstract only).

Kohn, Supercritical Fluids Try for CPI Applications, Mar. 12, 1979, Chemical Engineering.

LAU, Solventless Low Dielectric Constant Thin Films, NSF/SRC Engineering Research Center for Environmentally Benign Semiconductor Manufacturing.

Los Alamos National Laboratory, Los Alamos Engineers Solve Chip Makers Dilemma. 1998. News Release.

Lu, Solvatochromic Properties of Near– and Supercritical Ethanol and Nearcritical Acetic Acid, 2000, [77g], 2000 AIChE Annual Meeting (Abstract only).

Maslow, Effect of Developer Temperature and Normality On Chemically Amplified Photoresist Dissolution FINLE Technologies Inc., Austin, TX.

Medlin, Promising Polymers, 1995, Environmental Heath Perspectives vol. 103, No. 1, Jan. 1995.

Ngo, Spectroscopic Measurement of the Solubility of Organic Solids in Supercritical Fluids, 2000, [77a], AIChE 2000 Annual Meeting (Abstract Only).

Novick, Liquid Carbon Dioxide as a Medium for Polymeric Coatings, 2000, [118a], AIChE 2000 Annual Meeting (Abstract Only).

Ober, Polymers and Lithography, Spring 2000, Nanobiotechnology MSE 563/AEP 663, Cornell University.

O'Connor, New Developments in Activated Carbon Weighed, Oct. 2, 1978, C&EN.

Peters, Resists Join the Sub–n Revolution, Sep. 1999, Cahners Semiconductor International.

Peters, Low–k Dielectrics: Will Spin–On or CVD Prevail?, Jun. 2000, Cahners Semiconductor International.

Poliakoff, Flow Reactors, Jul. 1997, The Clean Technology Research Group, Nottingham.ac.uk web page.

Rubin, Supercritical Fluids as Water Cleaners, Sep. 2000, Semiconductor.net web page.

Russick, Supercritical Carbon Dioxide Extraction of Solvent from Micromachined Structures, Mar. 1996, Spring National Meeting of the American Chemical Society, New Orleans, LA (Abstract only).

Shaw, Negative Photoresists for Optical Lithography, 1997, IBM Journal of Research & Development, vol. 41, No. 1/2.

Srinivasan, Polyimide Formation in a Supercritical Medium, 2000, [150c], AIChE 2000 Annual Meeting (Abstract Only).

Tel's Clean Track Act 8, Spin–On Dielectric Tools, Product Brochure.

Tokyo Electron, Low k Toolset, SOD Technology, Product Prochure.

Wafer Fabrication Materials, Company Overview and Products, Electronicmaterials.com website, printed Mar. 14, 2001.

Weibel, Innovations in Supercritical Fluid Technology, Department of Materials Science and Engineering, Cornell University.

Williams, Removal of Polymer Coatings with Supercritical Fluids, 2000, 2000 AIChE Annual Meeting (Abstract only).

Wilson, Materials Made Under Pressure, Dec. 18, 2000, vol. 78, No. 51, Chemical.

Winebarger, International Sematech Completes First Phase of Low–k Material Evaluations, Mar. 10, 2000, News Release.

* cited by examiner

METHOD FOR REMOVING A SACRIFICIAL MATERIAL WITH A COMPRESSED FLUID

This application claims priority from U.S. provisional application 60/298,529 to Reid et al. filed Jun. 15, 2001, the subject matter of which is incorporated herein by reference.

BACKGROUND

A wide variety of micro-electromechanical devices (MEMS) are known, including accelerometers, DC relay and RF switches, optical cross connects and optical switches, microlenses, reflectors and beam splitters, filters, oscillators and antenna system components, variable capacitors and inductors, switched banks of filters, resonant comb-drives and resonant beams, and micromirror arrays for direct view and projection displays. There are a wide variety of methods for forming MEMS devices, including a) forming micromechanical structures monolithically on the same substrate as actuation or detection circuitry, b) forming the micromechanical structures on a separate substrate and transferring the formed structures to a circuit substrate, c) forming circuitry on one substrate and forming micromechanical elements on another substrate and bonding the substrates side by side or in a flip-chip type arrangement. Regardless of the actual method used, at some point in the manufacturing process for making MEMS devices, a sacrificial layer is generally removed in order to release the micromechanical structure. The released structure is then able to be actively actuated or moved, such as pivoting or rotation of a micromirror for a projection display or optical switch, or movement during sensing, such as an accelerometer in an automobile airbag system.

SUMMARY OF THE INVENTION

The present invention is directed to a method for releasing a micromechanical structure, comprising providing a substrate; providing a sacrificial layer directly or indirectly on the substrate; providing one or more micromechanical structural layers on the sacrificial layer; and releasing the one or more micromechanical structural layers by removing the sacrificial layer with a supercritical fluid. The sacrificial layer preferably comprises an organic material.

The invention is more particularly directed to a method comprising depositing an organic material on a substrate; depositing additional material different from said organic material after depositing the organic material; and removing the organic material with a compressed fluid. The invention is also directed to a method comprising: providing an organic layer on a substrate; after providing the organic layer, providing one or more layers of a material different than the organic material of the organic layer; removing the organic layer with a compressed fluid; and providing an anti-stiction agent with a compressed fluid to material remaining after removal of the organic layer. For performing such methods, an apparatus can be provided having a chamber, a holder for holding the device to be processed, a source of supercritical CO2 connected directly or indirectly to the chamber, a source of solvent connected directly or indirectly to the chamber, and a source of stiction agent connected directly or indirectly to the chamber.

DETAILED DESCRIPTION

Throughout the present application structures or layers are disclosed as being "on" (or deposited on), or over, above, adjacent, etc. other structures or layers. It should be recognized that this is meant to mean directly or indirectly on, over, above, adjacent, etc., as it will be recognized in the art that a variety of intermediate layers or structures could be interposed, including but not limited to sealant layers, adhesion promotion layers, electrically conductive layers, layers for reducing stiction, etc. In the same way, structures such as substrate or layer can be as a laminate due to additional structures or layers. Also, when the phrase "at least one" or "one or more" (or similar) is used, it is for emphasizing the potential plural nature of that particular structure or layer (particularly for ease of claim drafting), however this phraseology should in no way imply the lack of potential plurality of other structures or layers that are not set forth in this way. In the same way, when the phrase "directly or indirectly" is used, it should in no way restrict, elsewhere where this phrase is not used, the meaning elsewhere to either directly or indirectly. Also, "MEMS", "micromechanical" and "micro electromechanical" are used interchangeably herein and, in addition to the microscopic (or smaller) mechanical aspect, the structure may or may not have an electrical component. Lastly, unless the word "means" in a "means for" phrase is specifically set forth in the claims, it is not intended that any elements in the claims be interpreted in accordance with the specific rules relating to "means for" phraseology.

MEMS Device Fabrication:

Processes for microfabricating a MEMS device such as a movable micromirror and mirror array are disclosed in U.S. Pat. Nos. 5,835,256 and 6,046,840 both to Huibers, the subject matter of each being incorporated herein by reference. A similar process for forming MEMS movable elements (e.g. mirrors) on a wafer substrate (e.g. a light transmissive substrate or a substrate comprising CMOS or other circuitry) is illustrated in FIGS. 1 to 4.

Figure 1A:
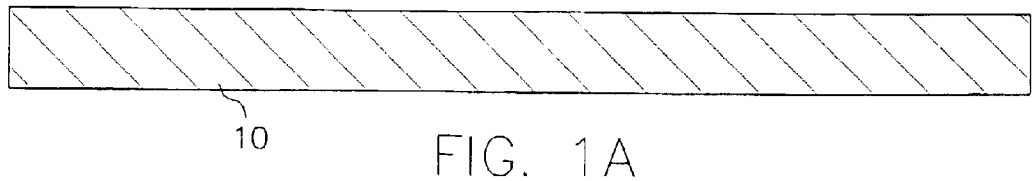
FIGS. 1A to 1E illustrate one method for forming micromirrors.

FIGS. 1A to 1D show a manufacturing process for one example of a micromechanical (mirror) structure. As can be seen in FIG. 1A, a substrate such as glass (e.g. Corning 1737F or Eagle2000), quartz, Pyrex™, sapphire, (or silicon alone or with circuitry thereon) etc. is provided. The cross section of FIGS. 1A–D is taken along line 1—1 of FIG. 2. Because this cross section is taken along the hinge of the movable element, an optional block layer 12 can be provided to block light (incident through the light transmissive substrate during use) from reflecting off of the hinge and potentially causing diffraction and lowering the contrast ratio (if the substrate is transparent).

Figure 1B:
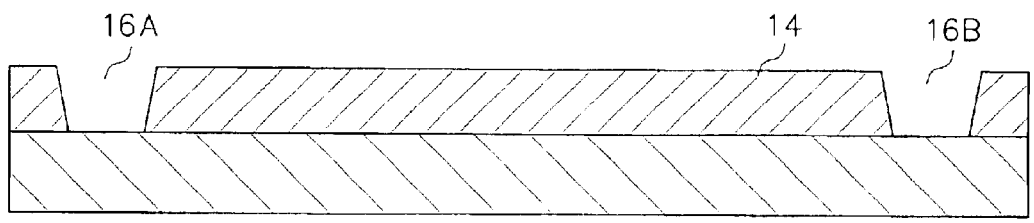

As can be seen in FIG. 1B, an organic sacrificial layer 14 (made of a material comprising a carbon compound) is deposited. The thickness of the sacrificial layer can be wide ranging depending upon the movable element/mirror size and desired tilt angle, though a thickness of from 500 Å to 50,000 Å, preferably around 5000 Å is preferred. As will be discussed in further detail below, a lithography step is performed with a resist (on top of the sacrificial layer), or, if the sacrificial layer comprises a light sensitive material, the sacrificial layer can be directly patterned without the need for a separate resist. Either way, holes 16a,b are formed in the sacrificial organic material, which holes can be any suitable size, though preferably having a diameter of from 0.1 to 1.5 um, more preferably around 0.7+/−0.25 um. The etching is performed down to the glass/quartz substrate or down to the block layer if present. Preferably if the glass/quartz layer is etched, it is in an amount less than 2000 Å.

Figure 1C:
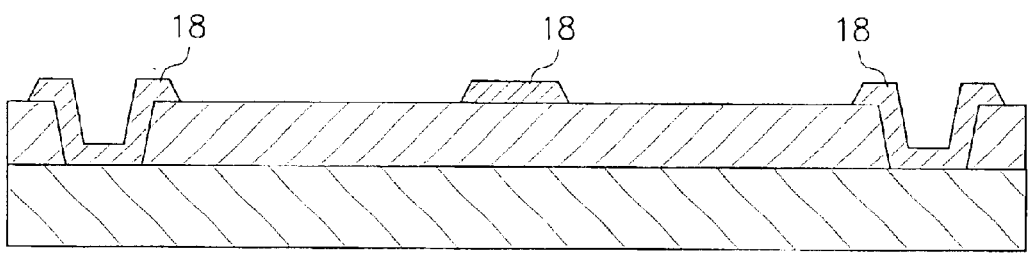

At this point, as can be seen in FIG. 1C, a first layer 18 is deposited by chemical vapor deposition. Preferably the material is silicon nitride or silicon oxide deposited by any suitable method such as sputtering, LPCVD or PECVD, however other materials such as polysilicon, amorphous silicon, silicon carbide or a different organic compound could be deposited at this point. The thickness of this first layer can vary depending upon the movable element size and desired amount of stiffness of the element, however in one embodiment the layer has a thickness of from 100 to 3200 Å, more preferably around 1100 Å. Though the first layer can be patterned at this point, it is preferred that the first layer be patterned after all the structural layers are deposited (so as to form deflectable elements with gaps between adjacent deflectable elements of from 0.1 to 25 um, preferably around 1 to 2 um.

Figure 1D:
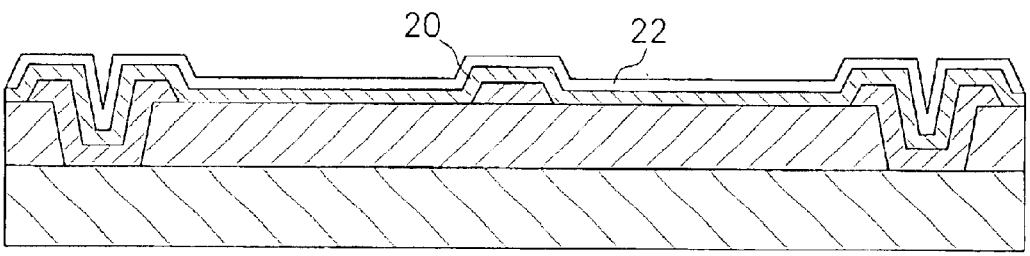
Figure 1E:
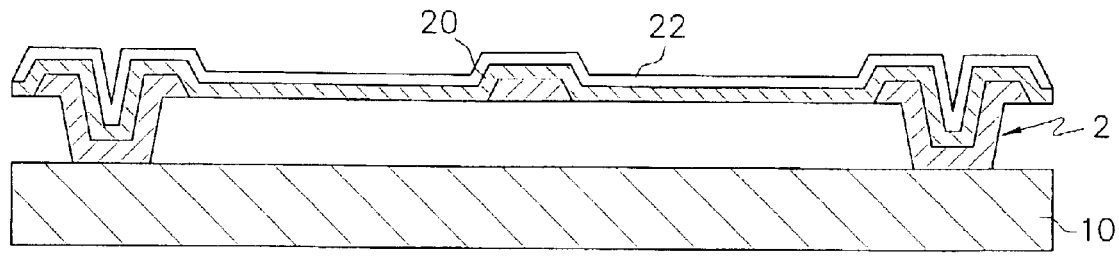
Figure 2:
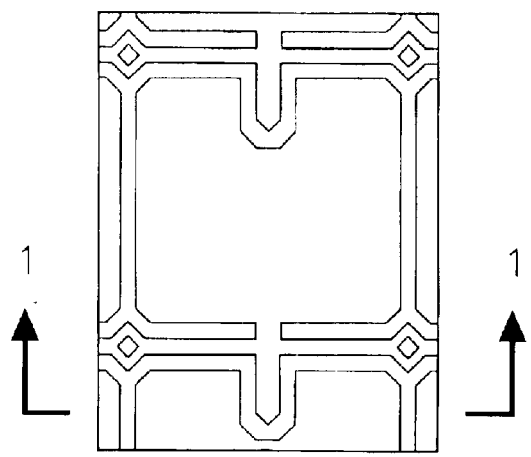
FIG. 2 is a top view of a micromirror showing line 1—1 for taking the cross section for FIGS. 1A to 1E.
Figure 3A:
FIGS. 3A to 3E illustrate the same method as in FIGS. 1A to 1D but taken along a different cross section.
Figure 3B:
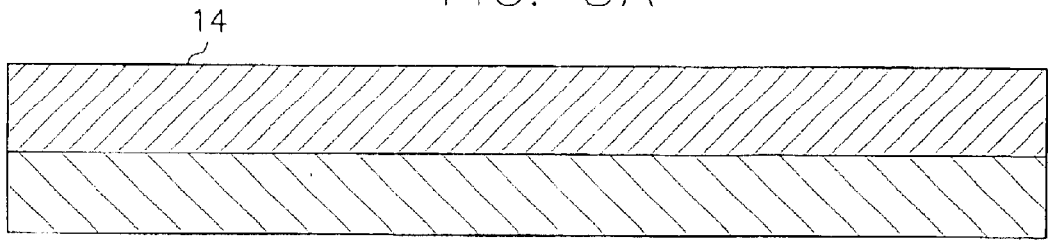
Figure 3C:
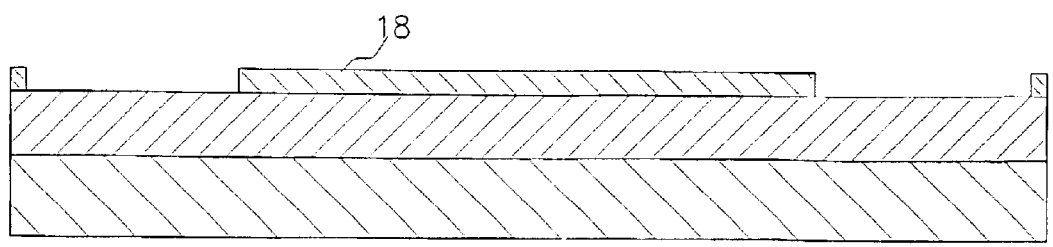
Figure 3D:
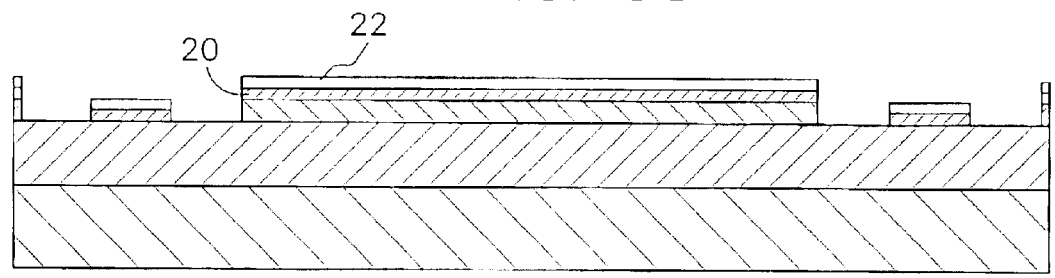
Figure 3E:
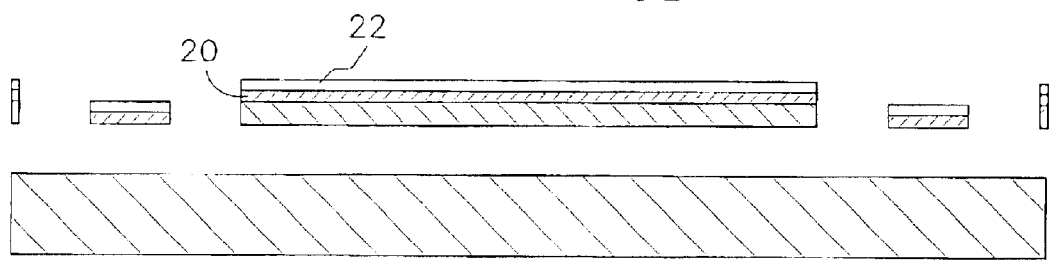
Figure 4:
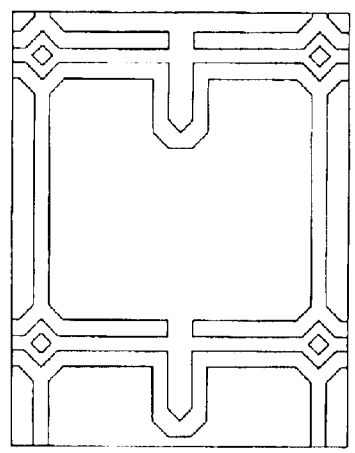
FIG. 4 is a top view of a mirror showing line 3—3 for taking the cross section for FIGS. 3A to 3E.

A second layer 20 (the "hinge" layer) is deposited as can be seen in FIG. 1D. By "hinge layer" it is meant the layer that defines that portion of the device that flexes to allow movement of the device. The hinge layer can be disposed only for defining the hinge, or for defining the hinge and other areas such as the mirror. In any case, it is preferred that the first layer is removed in hinge areas prior to depositing the hinge material (second layer). The material for the second (hinge) layer can be the same (e.g. silicon nitride) as the first layer or different (silicon oxide, silicon carbide, polysilicon, etc.) and can be deposited by any suitable method such as sputtering or chemical vapor deposition as for the first layer. The thickness of the second/hinge layer can be greater or less than the first, depending upon the stiffness of the movable element, the flexibility of the hinge desired, the material used, etc. In one embodiment the second layer has a thickness of from 50 Å to 2100 Å, and preferably around 500 Å. In another embodiment, the first layer is deposited by PECVD and the second layer by LPCVD.

As also seen in FIG. 1D, a reflective and conductive layer 22 is deposited. The reflective/conductive material can be gold, aluminum or other metal, or an alloy of more than one metal though it is preferably aluminum deposited by PVD. The thickness of the metal layer can be from 50 to 2000 Å, preferably around 500 Å. It is also possible to deposit separate reflective and conductive layers. An optional metal passivation layer (not shown) can be added, e.g. a 10 to 1100 Å TiN or TiON layer deposited by PECVD. Then, photoresist patterning on the metal layer is followed by etching through the metal layer with a suitable metal etchant. In the case of an aluminum layer, a chlorine (or bromine) chemistry can be used (e.g. a plasma/RIE etch with $Cl_2$ and/or $BCl_3$ (or Cl2, CCl4, Br2, $CBr_4$, etc.) with an optional preferably inert diluent such as Ar and/or He).

In the embodiment illustrated in FIGS. 1A to 1D, both the first and second layers are deposited in the area defining the movable (mirror) element, whereas the second layer, in the absence of the first layer, is deposited in the area of the hinge. It is also possible to use more than two layers to produce a laminate movable element, which can be desirable particularly when the size of the movable element is increased such as for switching light beams in an optical switch. A plurality of layers could be provided in place of single layer 18 in FIG. 1C, and a plurality of layers could be provided in place of layer 20 and in place of layer 22. Or, layers 20 and 22 could be a single layer, e.g. a pure metal layer or a metal alloy layer or a layer that is a mixture of e.g. a dielectric or semiconductor and a metal. Some materials for such layer or layers that could comprise alloys of metals and dielectrics or compounds of metals (particularly the transition metals) and nitrogen, oxygen or carbon are disclosed in U.S. provisional patent application 60/228,007, the subject matter of which is incorporated herein by reference.

Whatever the specific combination, it is desirable that the first/reinforcing layer(s) is provided and patterned (at least in the hinge area) prior to depositing and patterning the hinge material and metal. In one embodiment, the reinforcing layer is removed in the area of the hinge, followed by depositing the hinge layer and patterning both reinforcing and hinge layer together. This joint patterning of the reinforcing layer and hinge layer can be done with the same etchant (e.g. if the two layers are of the same material) or consecutively with different etchants. The reinforcing and hinge layers can be etched with a chlorine chemistry or a fluorine chemistry where the etchant is a perfluorocarbon or hydrofluorocarbon (or SF6) that is energized so as to selectively etch the reinforcing and/or hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Of course, if different materials are used for the reinforcing layer and the hinge layer, then a different etchant can be employed for etching each layer. Alternatively, the reflective layer can be deposited before the first (reinforcing) and/or second (hinge) layer. Whether deposited prior to the hinge material or prior to both the hinge material and the reinforcing material, it is preferable that the metal be patterned (e.g. removed in the hinge area) prior to depositing and patterning the hinge material.

FIGS. 3A to 3D illustrate the same process taken along a different cross section (cross section 3—3 in FIG. 4) and show the optional block layer 12 deposited on the light transmissive substrate 10, followed by the sacrificial layer 14, layers 18, 20 and the metal layer 22. The cross sections in FIGS. 1A to 1D and 3A to 3D are taken along substantially square mirrors in FIGS. 2 and 4 respectively. However, the mirrors need not be square but can have other shapes that may decrease diffraction and increase the contrast ratio. Also, the hinges need not be torsion hinges but could instead be flexure hinges. Such hinges and mirrors are disclosed in U.S. provisional patent application 60/229,246 to Ilkov et al., the subject matter of which is incorporated herein by reference, and are disclosed further below.

Figure 5:
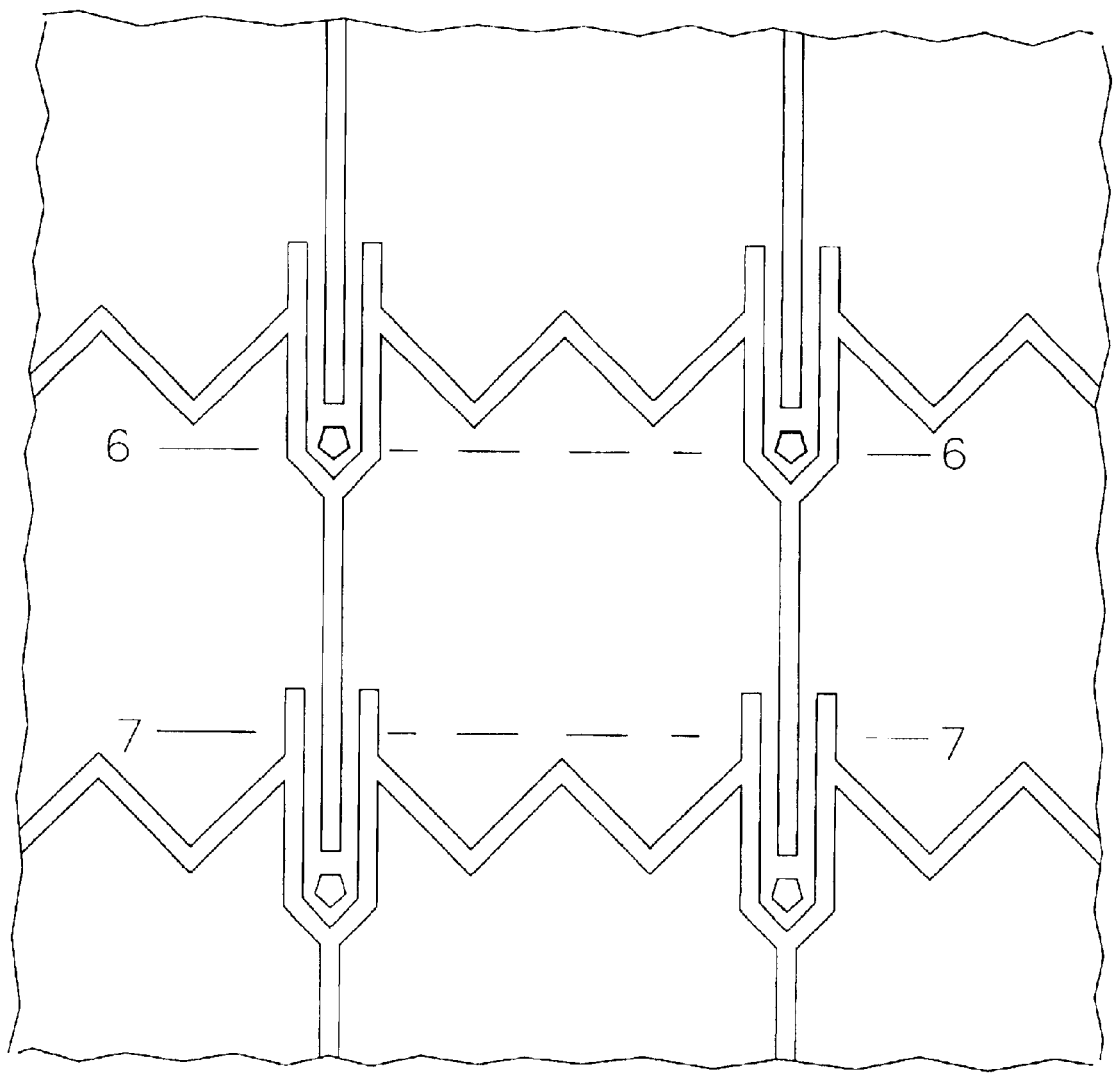
FIGS. 5 to 7 illustrate a method for making a different type of micromirror than that illustrated in FIG. 1–4.
Figure 6A:
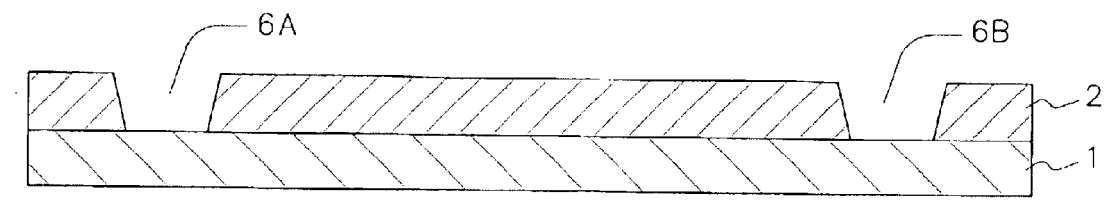
Figure 6B:
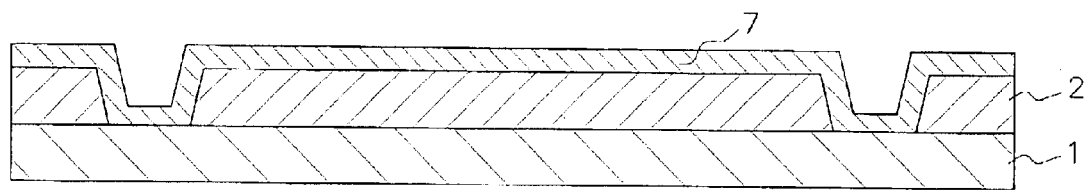
Figure 6C:
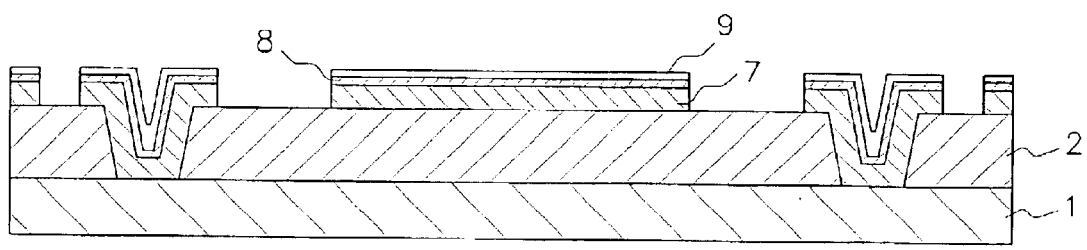

As can be seen in FIG. 5, a mirror having the shape as illustrated, is formed in accordance with the following. As can be seen in FIGS. 6a to 6c (taken along cross section 6 in FIG. 5), a substrate 1 (transparent substrate such as quartz, sapphire or glass—e.g. Corning 1737 or Eagle2000; or a silicon substrate with circuitry and electrodes) is provided. Not shown on the substrate are optional light blocking, transparent/conductive (e.g. tin oxide, indium oxide), or other layers that could be added prior to deposition of the sacrificial layer. Sacrificial layer 2 comprises a carbon compound, preferably an organic chemical compound, that is provided preferably by spin-on coating or spray coating.

As mentioned above, a separate photoresist can be provided on the organic layer in order to pattern the organic layer—in this case to provide holes for mirror posts. Or, if the organic layer comprises a substance that provides a photochemical route for modifying the dissolution rate of the organic material in a developer, then the organic layer can be patterned directly without an additional photoresist layer.

Either way, holes 6a and 6b are formed in the sacrificial organic material. The removal of organic material in the area of the holes is performed down to the glass/quartz substrate or down to any intermediate layers if present. At this point, as can be seen in FIG. 6B, a first layer 7 (e.g. amorphous silicon, polysilicon or a silicon compound such as silicon nitride or silicon dioxide) is deposited by deposited by any suitable method such as sputtering, LPCVD or PECVD, however other materials such as silicon carbide or a different organic compound could be deposited at this point. The thickness of this first layer can vary depending upon the movable element size and desired amount of stiffness of the element.

A second layer 8 (the "hinge" layer) is deposited as can be seen in FIG. 6C. By "hinge layer" it is meant the layer that defines that portion of the device that flexes to allow movement of the device. The hinge layer can be disposed only for defining the hinge, or for defining the hinge and other areas such as the mirror. In any case, it is preferred that the first layer is removed in hinge areas prior to depositing the hinge material (second layer). The material for the second (hinge) layer can be the same (e.g. silicon nitride) as the first layer or different (silicon oxide, silicon carbide, polysilicon, etc.) and can be deposited by any suitable method such as sputtering or chemical vapor deposition as for the first layer. The thickness of the second/hinge layer can be greater or less than the first, depending upon the stiffness of the movable element, the flexibility of the hinge desired, the material used, etc.

As also seen in FIG. 6C, a reflective and conductive layer 9 is deposited. The reflective/conductive material can be gold, aluminum or other metal, or an alloy of more than one metal though it is preferably aluminum deposited by PVD. It is also possible to deposit separate reflective and conductive layers. An optional metal passivation layer (not shown) can be added, e.g. a 10 to 1100 Å TiN or TiON layer deposited by PECVD. Then, photoresist patterning on the metal layer is followed by etching through the metal layer with a suitable metal etchant. In the case of an aluminum layer, a chlorine (or bromine) chemistry can be used (e.g. a plasma/RIE etch with $Cl_2$ and/or $BCl_3$ (or Cl2, CCl4, Br2, $CBr_4$, etc.) with an optional preferably inert diluent such as Ar and/or He).

Figure 7A:
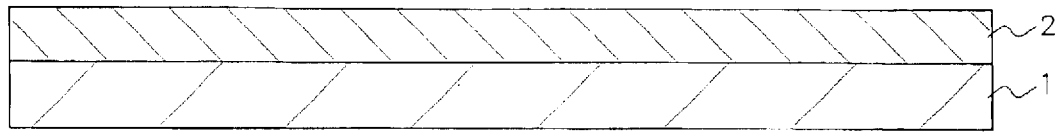
Figure 7B:
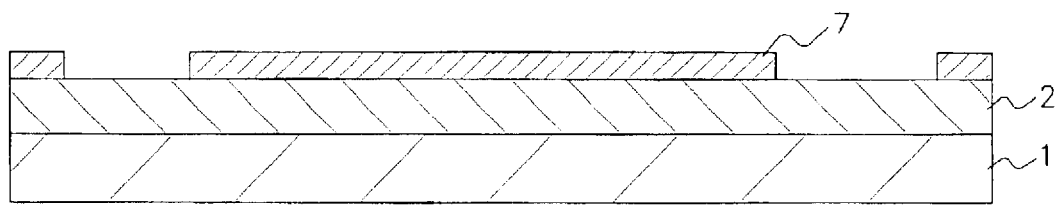
Figure 7C:
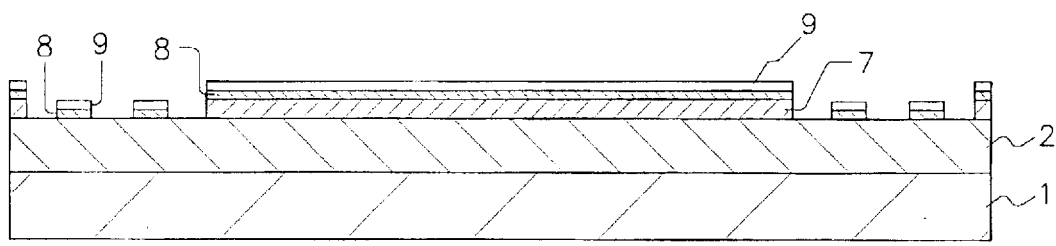

The reinforcing and hinge layers 7, 8 can be etched with a chlorine chemistry or a fluorine chemistry where the etchant is a perfluorocarbon or hydrofluorocarbon (or SF6) that is energized so as to selectively etch the reinforcing and/or hinge layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Of course, if different materials are used for the reinforcing layer and the hinge layer, then a different etchant can be employed for etching each layer. Alternatively, the reflective layer can be deposited before the first (reinforcing) and/or second (hinge) layer. Whether deposited prior to the hinge material or prior to both the hinge material and the reinforcing material, it is preferable that the metal be patterned (e.g. removed in the hinge area) prior to depositing and patterning the hinge material. FIGS. 7A to 7C illustrate the same process taken along a different cross section (cross section 7—7 in FIG. 5).

Organic Sacrificial Layer:

The sacrificial layer comprises an organic material, a carbon compound, that is deposited by, for example, spray-on or spin-coating. In one embodiment, the organic material is mixed with a solvent and deposited on a substrate. The solvent is preferably any known solvent for dissolving the organic material to be used, such as a supercritical fluid and/or a volatile organic solvent. The solvent is selected based on good handling, spinning and film forming properties (for spin on non-supercritical embodiments). In a preferred embodiment, a supercritical fluid, such as carbon dioxide, along with a cosolvent, dissolves a polymer and deposits the dissolved polymer on a substrate as a sacrificial layer.

The organic material of the sacrificial layer can be any suitable organic material, selected based on toxicity, type of solvent needed for dissolution, ease of handling, cost, etc. For example, the organic compound can be, or have a group in its molecule, selected from alkene, cyclic alkene and cyclic alkane, lactone, anhydride, amide, ketal, acetal, acid halide, halide, heterocycle, arene, ozonide, peroxide, epoxide, furan, lactam, aldehyde, detone, alcohol, nitro, hydroxylamine, nitrile, oxime, imine, azine, hydrazone, aniline, azide, ether, phenol, nitroso, azo, diazonium isothiocyanate, thiocyanate, cyanate, etc. Polymers can be used as the organic material—though the greater the cross linking the more likely that an organic solvent should be used as the supercritical fluid or as a cosolvent in the supercritical fluid. Preferred polymers are alkyds, acrylics, epoxies, fluorocarbons, phenolics, polyimides, polyurethanes, polyvinyls, polyxylylenes and silicones. Monomers, mixtures of monomers or monomers and polymers can also be used.

In one preferred embodiment, the organic material for the sacrificial layer is a photoresist, or photoresist resin. Thought it is not necessary to use a photoresist resin, there is the benefit that it is easily commercially available, and fab compatible. Also, if the photoresist resin is light sensitive or includes a photoactive compound, then the sacrificial layer can be patterned directly, without the need for a second photoresist for patterning. The photoresist resin can be used on its own (with solvent) or in its commercial embodiment (e.g. polymer/resin, photoacid generator (PAG), additives such as DI, plasticizer, and solvent). Resists, such as cyclized rubber or poly(chloromethylstyrene) can be used, as can a novolac-based resist, a hydroxystyrene-based resist, a cyclic olefin based resist, an acrylate-based resist or a fluorocarbon-based resist. As will be discussed further herein, the more crosslinked the resist (or other organic material) is, the more likely that a cosolvent will be desirable at the time of removal of the resist (or other organic material). The polymer can be made sensitive to light at a particular wavelength by the addition of a compound or by altering the polymer structure. For example, the novolac resist can be mixed with diazonaphthoquinone (DNQ) so that, upon exposure to, e.g. 365 nm light, the DNQ dissolution inhibitor is converted into a base-soluble acidic photoproduct that increases the dissolution rate of the novolac matrix in the exposed regions. The patterning of the sacrificial layer in the present invention, such as the formation of holes 16a, 16b in FIG. 1B, can be accomplished by masking the sacrificial layer in all areas except for the areas corresponding to holes 16a, 16b. Then, as will be discussed further herein, the holes are formed by use of a standard novolac/DNQ developer, or with a supercritical fluid with cosolvent (the cosolvent can be the same as the off-the-shelf developer, though dissolved in the supercritical fluid). As will be discussed further herein, the sacrificial layer can eventually be removed by using another solvent/developer, or with a supercritical fluid and optional cosolvent—or, preferably, when it is time to remove the remaining sacrificial material, the remainder is also exposed to 365 nm light and removed in an atmosphere of supercritical fluid (e.g. $CO_2$) and novolac/DNQ developer.

Chemically amplified polyhydroxystyrene (PHOST) polymers can also be used. The HOST polymer backbone has protecting groups that become deprotected when a photoacid generator (PAG) decomposes when exposed to 248 nm wavelength light (e.g. from an ArF excimer laser). The deprotection mechanism causes a polarity change in the resist polymer (from lipophilic to hydrophilic) making exposed regions soluble in a developer such as tetramethylammonium hydroxide (TMAH). The acid generation results from the light exposure, whereas the acid-catalyzed reactions take place during a post-exposure bake (PEB). The use of a polar solvent, such as alcohol or aqueous base results in the generation of positive-tone images, whereas development with a nonpolar organic solvent such as anisole provides negative-tone images. As mentioned above, the sacrificial layer can be patterned such as to form holes 16a and 16b, with the remainder later exposed to 248 nm light in order to be removed in an atmosphere of a supercritical fluid and developer (e.g. TMAH). Likewise, a 193 nm photoresist (e.g. an acrylic or cyclic olefin polymer) could be used, where initial patterning and later removal are accomplished upon exposure to 193 nm wavelength light (e.g. from a KrF excimer laser). Other resists that have been used at 248 nm and 193 nm, such as polymethacrylates (e.g. poly(methyl methacrylate)), novolac resists, acrylic acid copolymers or alternating copolymers of styrene-maleic anhydride half ester (with aliphatic diazoketones and other dissolution inhibitors). Also usable are alternating copolymers of norbornene derivatives with maleic anhydride prepared by radical polymerization and polymers consisting of substituted norbornene repeat units with a transition metal catalyst. Other examples for the sacrificial material are maleic anhydride-cyclic olefin alternating copolymers, and poly (norborene-alt-maleic anhydride). Other chemically amplified resists that are composed of a polymer resin that is very soluble in an aqueous base developer, a protecting t-BOC group used to slow down the dissolution of the polymer, photo-acid generators and optional dyes and additives along with the casting solvent (or such polymer resin and casting solvent alone), could also be used.

Negative photoresists, namely those photosensitive films that become insoluble in solvents or water-based developers upon exposure to radiation, can also be used for the sacrificial layer. Preferred are organic materials that use photoinitiators that can generate free radicals or strong acids to facilitate polymeric cross-linking or the photopolymerization of monomeric or oligomeric species. Without an increase in molecular weight, negative patterns can be achieved by the photochemical formation of hydrophobic or hydrophilic groups which provide preferential solubility between the exposed and unexposed resist film. Another way to increase molecular weight is by cationically polymerizing monomers such as epoxies and vinyl compounds, or by enabling condensation reactions between phenol formaldehyde resins and amino-based cross-linkers. Changes in polarity can be achieved through the acid-catalyzed deprotection of a variety of esters. Two negative photoresist examples include Shell Chemical EPON resin SU-8 and Shipley Negative Resist SNR 248.

Other specific examples of commercially available photoresists include a g-Line photoresist (e.g. Shipley Megaposit SPT3000), an i-Line photoresist (e.g. Shipley Megaposit SPR220 or SPR350) or a DUV photoresist (e.g. Shipley UV110 Series DUV). In a simple form, the photoresist sacrificial layer is a single organic component material such as PMMA (poly(methyl methacrylate). The photoresist can be an organic compound and a photocactive compound, such as DNQ-novolac photoresist (regardless of whether the photoresist sacrificial layer will be directly patterned. If the photoresist sacrificial layer will not be directly patterned (and an additional mask or photoresist layer is used for patterning the sacrificial layer), then the diazonaphthoquinone is not needed and a novolac resin can be used alone (e.g. a novolac made from a feed that is a mixture of meta-cresol, para-cresol and other additives as known in the art). Preferably, the number average molecular weight of the novolac is between 1000 and 3000, and the weight average molecular weight is preferably 20,000 or less. It is also possible to use a photoresist that includes a dye, such as Shipley SPR-3617, so as to allow for optical monitoring of the removal of the sacrificial layer.

In a particularly preferred embodiment, the sacrificial material is an organosilicon or fluorinated polymer, such as, though not limited to, 157 nm photoresists. Many fluorinated hydrocarbons have the ability to dissolve in supercritical carbon dioxide without the need for a cosolvent, or with much lower amounts of such cosolvents. Fluoropolymers can also be made and/or deposited on the wafer substrate in supercritical carbon dioxide, thus allowing for a "greener" method of making, depositing, patterning and removing the sacrificial material. In addition, if a separate photoresist is not used for patterning the sacrificial layer, a fluorocarbon photoresist material could be directly patterned with a fluorine excimer laser (e.g. a VUV 157 nm GAM laser, Lambda-Physik Novaline F1030—1000 Hz 157 nm fluorine laser, or a Cymer ELX-6500 1000 Hz 157 nm fluorine laser). Fluorinated versions of commercial photoresists (e.g. fluorinated novolacs, methacrylates) as well as fluorinated-based acrylates, and fluorinated-based norbornyl and maleic anhydride copolymers can be used. For example, fluorinated octyl methacrylate copolymers could be used, as well as poly(chlorotrifluoroethylene), fluorinated poly (methylmethacrylate), fluorinated styrenes, poly(vinylidene fluoride), polyhexafluoropropylene, poly (tetrafluoroethylene), copolymers from t-butyl methacrylate and pentafluoropropyl methacrylate, a fluoroacrylate polymer, and polyfluoropolyether graft copolymers. Fluoropolymers can be used alone and unmodified (spin coated and developed in liquid or supercritical $CO_2$) or with a photoacid generator and acid labile leaving groups. Block copolymers where one of the components is fluorinated (e.g. a block copolymer comprising polystyrene and poly (1,1-dihydroperfluorooctyl acrylate)

In addition to fluoropolymers, siloxane based materials (silicones) are desirable for use as the sacrificial material of the present invention. Silicones are a class of polymers that have a repeating Si—O backbone with organic functional groups attached to the Si via Si—C bonds. Examples include poly(dimethyl siloxane) polymers and copolymers, and copolymers of t-butyl methacrylate and 3-methacryloxypropylpentamethyldisiloxane. Silicones (polyorganosiloxanes) are desirable for use in the present invention not only for their solubility in carbon dioxide, but they can be directly patterned (exposed to, for example, 400 nm light to photooxidize a pattern in the silicone, followed by etching areas in the silicone film that are not photooxidized. Siloxanes and fluoropolymers such as disclosed in U.S. Pat. Nos. 6,174,631 and 6,096,460 both to French et al. (du Pont), and fluoropolymers such as disclosed in WO 017712 and WO 0067072 both to Feiring et al. (du Pont), can be used as the sacrificial layer in the present invention (each of these du Pont references being incorporated herein by reference). Examples include a) a fluorine-containing polymer comprising a repeat unit derived from at least one ethylenically unsaturated compound containing a fluoroalcohol functional group, b) a fluorine-containing copolymer comprising a repeat unit derived from at least one ethylenically unsaturated compound, where at least one ethylenically unsaturated compound is polycyclic and at least one ethylenicaly unsaturated compound contains at least one fluorine atom covalently attached to an ethylenically unsaturated carbon atom, c) a fluorine containing copolymer having a repeat unit derived from at least one polycyclic ethylenically unsaturated compound having at least one atom or group selected from the group consisting of fluorine atom, perfluoroalkyl group and perfluoroalkoxy group, d) organosilicates containing aromatic groups (e.g. derived from benzene and phenanthrene), optionally diluted with an organosilicate diluent molecule, e) a fluorocarbon blend (such as a polysilicate fluorocarbon mixture), and e) polysiloxane polymers and polysiloxane polymers doped with a chromophore. In the present invention, fluorinated polymers, polysiloxanes and organosilicates are preferred for their ability to be dissolved to varying degrees in pure liquid, sub-, near- and super-critical carbon dioxide or in the same with only small amounts of cosolvents.

The organic material for the sacrificial layer can be deposited by spin coating, as is known in the art for depositing photoresist. It is also possible to deposit a polymer using chemical vapor deposition (CVD). In one embodiment of the invention, pulsed plasma enhanced CVD is used to deposit a polymer film, and in another embodiment of the invention pyrolytic CVD is used. Amorphous cross-linked networks can be deposited in this way, as can specific linear perfluoroalkyl chains (bulk poly (tetrafluoroethylene). Both organosilicon and fluorocarbon thin films can be deposited by chemical vapor deposition. Continuous PECVD (plasma enhanced chemical vapor deposition) can be used, though it results in greater crosslinking sites than pulsed PECVD or pyrolytic CVD. After CVD deposition, the organic sacrificial material can be both patterned and ultimately removed with a supercritical fluid such as carbon dioxide (with an optional cosolvent), or patterned in a traditional (wet chemical) manner, but removed with a supercritical fluid, with or without an additional cosolvent. CVD of fluorocarbons is disclosed, for example, in Smith et al. "Thin Teflon-Like Films for Eliminating Adhesion in Released Polysilicon Microstructures", Sandia National Laboratories, Albuquerque, N.M., the subject matter of which is incorporated herein by reference. Also, chemical vapor deposition of polymer films is disclosed in U.S. Pat. Nos. 5,888,591, 6,156,435, and 6,153,269 all to Gleason et al., the subject matter of each being incorporated herein by reference. Pyrolytic chemical vapor deposition (of silicone films) is disclosed in U.S. Pat. No. 6,045,877 to Gleason et al., also incorporated herein by reference. In addition to patterning at 157 nm with a fluorine laser, as mentioned hereinabove, a fluorocarbon sacrificial layer can be patterned with electron beam lithography, such as disclosed in Stritsman and Ober, *Patterning of CVD Fluorocarbon Resist Using Electron Beam Lithography and Supercritical CO2 Development*, Cornell University, Cornell Nanofabrication Facility, National Nanofabrication Users Network, p.32, the subject matter of which being incorporated herein by reference.

In the alternative to CVD, the organic sacrificial layer can be deposited with a liquified gas, such as liquid $CO_2$, or with supercritical $CO_2$. Polymers, particularly fluorinated polymers can be formed as a film on a solid substrate using dip-coating with liquid carbon dioxide as the solvent. Also, liquid carbon dioxide can be as the solvent for spin coating photoresist (e.g. fluorocarbon photoresist) on a substrate (glass, silicon, etc.). Or, supercritical $CO_2$ could be used instead of liquid $CO_2$ in a RESS (Rapid Expansion of Supercritical Solution) to form a particulate coating as the sacrificial layer.

In order to use liquid $CO_2$ as a solvent for spin coating, a high-pressure coating chamber with rotating chuck is useful. To spin coat from liquid $CO_2$, the resist should be soluble in liquid $CO_2$, or soluble in whatever supercritical fluid is used (alone or with a cosolvent). An example of liquid $CO_2$ as a medium for spin coating is dislcosed in Kendall et al. "Liquid Carbon Dioxide Spin Coating Process for Deep-UV Photoresists", conference paper from Fluorine in Coatings III, Orlando, Fla. 25–27, Jan. 1999, paper 34; and Hoggan et al. "Spin Coating and Photolithography using Liquid and Supercritical Carbon Dioxide", conference paper from ACS, New Orleans, La. 22–26, Aug. 1999, pp 47–8, both being incorporated herein by reference. Without a cosolvent, fluorinated polymers are preferred for their solubility in liquid $CO_2$. For example, a fluorinated octyl methacrylate copolymer can be dissolved in liquid $CO_2$ and spin coated in a high-pressure spin coating apparatus. And, if a photoacid generator is used in conjunction with the fluorinated polymer, the photoacid generator can be fluorinated to improve solubility in the liquid $CO_2$ (e.g. 2-perfluorohexyl-6-nitrobenzyl tosylate).

Instead of liquid $CO_2$, supercritical $CO_2$ can be used in a RESS process. In RESS, a product in, for example a supercritical carbon dioxide solution, which product is provided for the RESS process or is chemically formed upstream, is deposited as micron sized particles by rapid expansion through a nozzle. The solution is preferably heated to around 80 degrees C. before expansion and/or the pressure is reduced to 70 bar, where the product is insoluble. The expansion nozzle may be a short length of stainless steel capillary or a fine hole cut by laser in a stainless steel plate. The flow may be supersonic or subsonic in the nozzle. In the RESS process, non-volatile solutes are dissolved in a supercritical fluid, which results in a solute laden supercritical phase. A relatively small change in pressure of the supercritical phase can lead to a large decrease in solvent density, and hence solvent power. By the rapid expansion, or depressurisation, of the supercritical solution, a high supersaturation can be obtained. This high supersaturation leads to high nucleation rates and the precipitation of very fine particles when the solution is rapidly expanded through the nozzle. The rapid expansion creates uniform conditions within the nucleating medium so that the precipitated particles have a narrow particle size distribution. Particle size and distribution can be controlled by manipulating RESS operational parameters such as the geometric characteristics of the nozzle, pre-expansion temperature and pressure, and expansion temperature and pressure, and the concentration of the solute in the supercritical solution. See, for example C. J. Chang et. al. "Precipitation of Microsize Organic Particles from Supercritical Fluids" AlChE Journal Vol. 35, No 11, p1876, (1989), and D. W. Matson et.al: "Rapid Expansion of Supercritical Fluid Solutions: Solute Formation of Powders, Thin Films, and Fibers" Ind. Eng. Chem. Res, 26, p2298, (1987). A cosolvent can also be used along with supercritical carbon dioxide, such as disclosed in J. W. Tom et.al.: "Application of Supercritical Fluids in The Controlled Release of Drugs" Supercritical Fluid Engineering Science, Chapter 19, p238, (1993). Any of the wide variety of types of poly (tetrafluoroethylene), including for example Teflon AF (family of amorphous copolymers based on bistrifluoromethyl, difluoro, dioxole, and other fluorine containing monomers), could be deposited with liquid CO2 or supercritical CO2 as outlined above. Other fluorinated polymers, and other polymers with a cosolvent incorporated into the polymer backbone, could be deposited as above. Methods for coating substrates using carbon dioxide are disclosed in U.S. Pat. Nos. 6,165,559, 6,165,560, and 6,200,637, the subject matter of each being incorporated by reference, as well as in WO 027544 assigned to North Carolina State University. Prior to deposition of the fluoropolymer on the substrate (whether in an atomosphere of liquid or supercritical CO2 or by using a traditional solvent), the fluoropolymer can be synthesized in an atmosphere of supercritical CO2, such as in WO 00/68170, U.S. Pat. No. 5,981,673 or U.S. Pat. No. 5,922,833, each assigned to Univ. of N. Carolina, Chapel Hill, the subject matter of each being incorporated herein by reference.

Spin-on organic (or organic-inorganic hybrid) low-k materials can also be used for the sacrificial layer of the present invention. Examples include FLARE™ (an organic spin-on polymer for use as a low-k interlayer dielectric), HOSP™ (a spin-on hybrid siloxane-organic polymer), ACCUFLO™T-13EL (an organic polymer in an organic solvent system) 314, 214 Spin-On Glass (SOG) series (a family of siloxane polymers), AccuGlass™T-12B Spin On Glass (belongs to the methylsiloxane family of polymers) and 311, 211, 111 Spin On Glass (SOG) series (family of methylsiloxanes that combine organic groups on an inorganic polymer backbone), SiLK™ (a spin-on organic polymer deposited using a conventional spin-coater), Cyclotene™ (derived from B-staged bisbenzocyclobutene monomers), and PTFE spin-on films from W. L. Gore (Elkton, Md.) and CVD PTFE films from SVG Thermco Group. These low-k materials can be deposited by spin-on with traditional solvents (e.g. mesitylene, gamma butyrolactone) or in liquid carbon dioxide alone or with small amounts of cosolvent. The siloxane-based low-k materials are useful for being able to be deposited and removed with liquid or supercritical carbon dioxide without the need for cosolvents (or with minimal amounts of cosolvents). Many low-k materials are also beneficial in that they can be directly patterned (no photoresist for patterning)—see, for example, Weibel G L, Lewis H G P, Gleason K K, Ober C K. "Patternable low-k dielectrics developed using supercritical CO2", Polymer Preprints, 2000, 41(2), 1838–1839, incorporated herein by reference. Adhesion promoters can also be used both before and after depositing the low-k material.

Deposition Solvents:

Solvents are needed for depositing the sacrificial material on the substrate, for patterning the material if needed, and eventually removing the sacrificial material in order to release the micromechanical structures. The release, in accordance with the present invention, is in a solvent that is a supercritical fluid. As will be discussed further herein, the supercritical fluid can be selected from a wide variety of fluids that can be provided in a supercritical state. A cosolvent is not needed. Examples include, ethylene, xenon, water, toluene, carbon dioxide, nitrous oxide, methanol, n-pentane, ethane, propane, isopropanol, n-butane and ammonia. If supercritical carbon dioxide is used, and the organic material of the sacrificial layer is an organosilicate or a fluoropolymer, the supercritical CO2 can be used without a cosolvent to remove the sacrificial material to release the micromechanical structures (the supercritical CO2 without cosolvent can also be used for depositing the sacrificial layer (e.g. in a RESS process), or liquid CO2 without cosolvent can be used for sacrificial layer spin-on as disclosed above). Of course, there are many non-fluorous polymers with high solubility in supercritical CO2—see, for example, Sarbu et al. "Non-Fluorous Polymers with Very High Solubility in Supercritical CO2 Down to Low Pressures", Nature, vol 405, no. 6783, 2000, pp. 165–168, the subject matter of which is incorporated herein by reference. The removal fluid can be a compressed fluid (a category that includes supercritical fluids, near-critical fluids, expanded liquids or highly compressed gases, depending upon temperature, pressure and composition)—though fluids in their supercritical state are preferred.

A cosolvent can be used along with the supercritical fluid to increase solubility of the sacrificial layer when being removed. This cosolvent can be the same solvent as used for spin-on of the sacrificial material when first deposited (or for patterning/developing the sacrificial layer) if such is performed in the traditional method without a supercritical fluid. If the sacrificial material is a photoresist and can be directly patterned, then a cosolvent used for removing the sacrificial material in the end to release the micromechanical structures may be different. Cosolvents are discussed in more detail in relation to organic sacrificial material removal—however, such solvents could be used in the traditional manner, or with a supercritical fluid, for deposition of the sacrificial layer.

If the sacrificial layer material is an off-the shelf photoresist, then the corresponding developer might be used for depositing the resist on the substrate, patterning and/or as the cosolvent with the supercritical fluid. The solvent that can be used with a novolac or novolac-DNQ can be any of a wide variety of known solvents for novolac resins, such as PGMEA (relatively nontoxic), cyclohexanone, acetone, ethyl lactate, NMP (1-methyl-2-pyrrolidinone), diglyme (diethyleneglycol dimethyl ether) or 1,2-propanediol monomethylether acetate. The photoresist can be formulated with a polymer loading of from about 15 to 30 percent by weight with respect to the solvent content of the resist solution.

Circuitry:

In the present invention, the circuitry can be formed together on the same substrate as the microstructures, such as in U.S. Pat. Nos. 5,061,049, 5,527,744, and 5,872,046. If the microstructures are not formed monolithically on the same wafer as the circuitry, then a second substrate can be provided having circuitry thereon (or, circuitry could be provided on both the first wafer and the replacement substrate if desired). If the microstructures are micromirrors, then it may be preferable to form circuitry and electrodes on a second wafer substrate with at least one electrode electrostatically controlling one pixel (one micromirror on the first wafer portion of the die) of the microdisplay. The voltage on each electrode on the surface of the backplane determines whether its corresponding microdisplay pixel is optically 'on' or 'off,' forming a visible image on the microdisplay. Details of the backplane and methods for producing a pulse-width-modulated grayscale or color image are disclosed in U.S. patent application Ser. No. 09/564,069 to Richards, the subject matter of which is incorporated herein by reference.

The display pixels themselves, in a preferred embodiment, are binary, always either fully 'on' or fully 'off,' and so the backplane design is purely digital. Though the micromirrors could be operated in analog mode, no analog capability is necessary. For ease of system design, the backplane's I/O and control logic preferably run at a voltage compatible with standard logic levels, e.g. 5V or 3.3V. To maximize the voltage available to drive the pixels, the backplane's array circuitry may run from a separate supply, preferably at a higher voltage.

One embodiment of the backplane can be fabricated in a foundry 5V logic process. The mirror electrodes can run at 0–5V or as high above 5V as reliability allows. The backplane could also be fabricated in a higher-voltage process such as a foundry Flash memory process using that process's high-voltage devices. The backplane could also be constructed in a high-voltage process with larger-geometry transistors capable of operating at 12V or more. A higher voltage backplane can produce an electrode voltage swing significantly higher than the 5–7V that the lower voltage backplane provides, and thus actuate the pixels more robustly.

In digital mode, it is possible to set each electrode to either state (on/off), and have that state persist until the state of the electrode is written again. A RAM-like structure, with one bit per pixel is one architecture that accomplishes this. One example is an SRAM-based pixel cell. Alternate well-known storage elements such as latches or DRAM (pass transistor plus capacitor) are also possible. If a dynamic storage element (e.g. a DRAM-like cell) is used, it is desirable that it be shielded from incident light that might otherwise cause leakage.

The perception of a grayscale or full-color image will be produced by modulating pixels rapidly on and off, for example according to the method in the above-mentioned U.S. patent application Ser. No. 09/564,069 to Richards. In order to support this, it is preferable that the backplane allows the array to be written in random-access fashion, though finer granularity than a row-at-a-time is generally not necessary.

It is desirable to minimize power consumption, primarily for thermal reasons. Decreasing electrical power dissipation will increase the optical/thermal power budget, allowing the microdisplay to tolerate the heat of more powerful lamps. Also, depending upon the way the microdisplay is assembled (wafer-to-wafer join+offset saw), it may be preferable for all I/O pads to be on one side of the die. To minimize the cost of the finished device it is desirable to minimize pin count. For example, multiplexing row address or other infrequently-used control signals onto the data bus can eliminate separate pins for these functions with a negligible throughput penalty (a few percent, e.g. one clock cycle for address information per row of data is acceptable). A data bus, a clock, and a small number of control signals (5 or less) are all that is necessary.

In use, the die can be illuminated with a 200 W or more arc lamp. The thermal and photocarrier effects of this may result in special layout efforts to make the metal layers as 'opaque' as possible over the active circuitry to reflect incident optical energy and minimize photocarrier and thermal effects. An on-chip PN diode could be included for measuring the temperature of the die.

In one embodiment the resolution is XGA; 1024×768 pixels, though other resolutions are possible. A pixel pitch of from 5 to 24 um is preferred (e.g. 14 um). The size of the electrode array itself is determined by the pixel pitch and resolution. A 14 um XGA device's pixel array will therefore be 14.336×10.752 mm.

Figure 8:
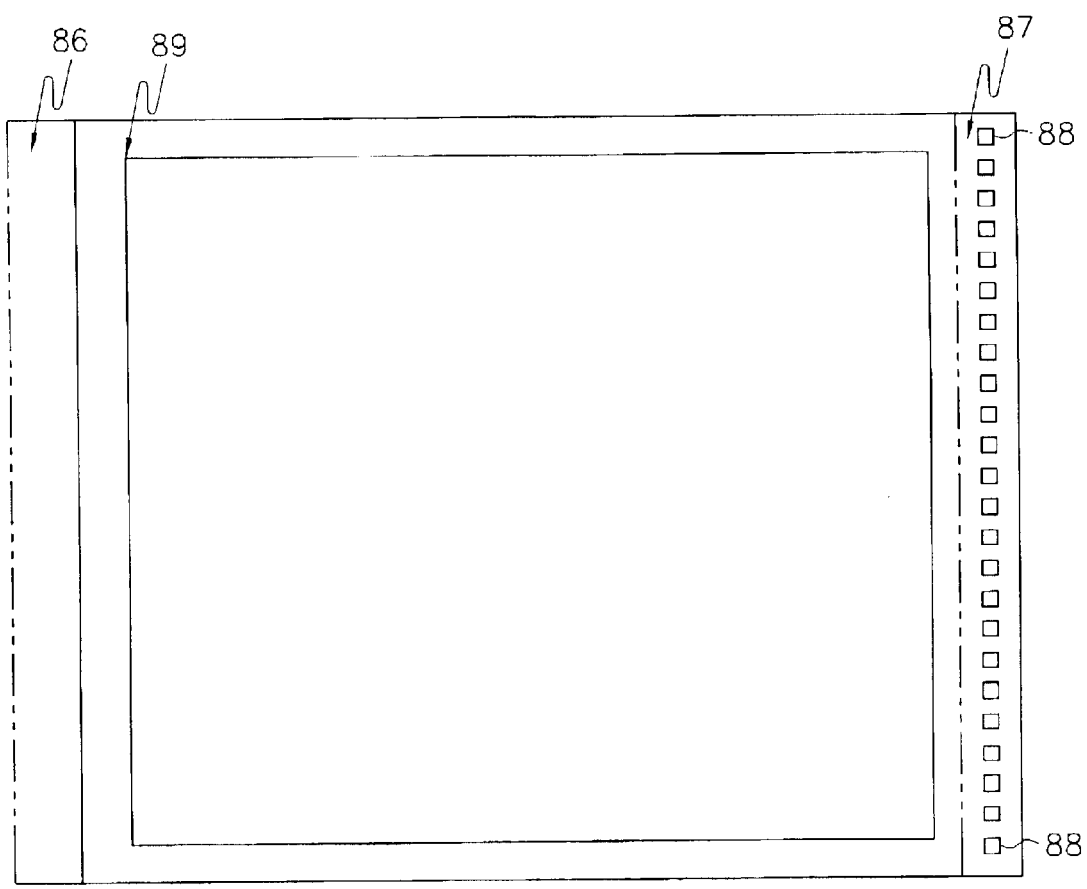
FIG. 8 is an illustration of the I/O pads and backplane for the mirror array of the present invention.

As can be seen in FIG. 8, the I/O pads (88) can be placed along the right edge of the die, as the die is viewed with pixel (0,0) (89 in FIG. 5) at the top left corner. Putting the pads on the 'short' (left/right) edge (87) of the die is preferable due to the slightly reduced die size. The choice of whether the I/O should go on the left vs. right edge of the die is of little importance since the display controller ASIC may support mirroring the displayed image in the horizontal axis, the vertical axis, or both. If it is desired to orient the display with the I/O on the left edge, the image may simply be rotated 180 degrees by the external display controller. The electrode voltage during operation is, in the low state 0V and in the high state preferably from 5 to 7V (or 12V or higher in the higher voltage design). Of course other voltages are possible, though lower actuation voltages are preferred. In one embodiment the electrodes are metal squares, though other geometries are possible. Standard CMOS passivation stackup over the electrodes can be provided.

Supercritical Fluid Release

Assembly of the micro-electromechanical device, where mechanical elements are formed on one substrate and circuitry for interacting with the mechanical components is provided on another substrate, involves connecting the two substrates together (e.g. back to back, side by side, or preferably in a flip chip approach). If the micro-mechanical elements comprise both micromechanical and electrical components (e.g. are provided monolithically with the, then no assembly of substrates is needed and the method can proceed directly to wire-bonding and packaging (though after release).

Supercritical Fluid:

In either case, the micro-mechanical elements are preferably first released by removing the sacrificial layer so as to free the MEMS elements (e.g. micromirrors) to move. In accordance with the invention, the organic sacrificial layer (or layers if multiple sacrificial layers are provided on the substrate) is removed with a supercritical fluid (or near-supercritical fluid). "Supercritical fluids" is the term used to describe those fluids that have been compressed beyond their critical pressure and also heated above their critical temperature. Both gases (e.g. carbon dioxide, nitrous oxide) and liquids (e.g. water) are suitable. More particularly, fluids that can be made into a supercritical fluid state for the present invention, include inorganic gases and organic gases, such as nitrogen, alkanes and preferably lower alkanes (e.g. methane, ethane, propane, butane), or alkenes, preferably lower alkenes (e.g. propylene). Also usable in the present invention are supercritical xenon, krypton, methanol, ethanol, isopropanol and isobutanol. Supercritical hydrocarbons or fluorocarbons could also be used, as well as partially fluorinated and perfluorinated halocarbons, and highly polar hydrogen bonding solvents. Other examples of supercritical fluids that could be used in the present invention include supercritical ethanol, acetic acid, xenon and ethane, and mixtures thereof.

More than one supercritical fluid can be used (as a mixture), and one or more cosolvents (discussed below) can also be used with the mixture of supercritical fluids. Various supercritical fluids and their critical temperatures and pressures are set forth on pages F-64 to F-66 in CRC Handbook of Chemistry and Physics, 68th Edition, 1987–1988 (these pages incorporated herein by reference). Near supercritical fluids also demonstrate solubility, viscosity, density, and behavior characteristics similar to supercritical fluids, and can be used, as can subcritical fluids (herein defined as a fluid below its critical temperature but above its critical pressure or vice versa), depending upon the fluid, whether there is an additional solvent, and the nature of the organic material being removed.

Solvents:

Solvents (used in their supercritical state or as a cosolvent with a supercritical fluid) can be selected based on their known ability for dissolving the organic material to be removed (or deposited or patterned). One approach that is used is to divide the Hildebrand's total solubility parameter into secondary intermolecular forces—dispersion, dipole-dipole and hydrogen bonding. When plotted in a three dimensional Cartesian coordinate system, each solvent and polymer can be represented by a "region" (see Barton, Allan, Handbook of Solubility Parameters and Other Cohesion Parameters, CRC Press, Inc., p. 8 and p. 141). Some obvious solvent candidates are those that have known solubility of particular photoresist materials, such as amyl acetate, butoxyethanol, gamma butyrolactone, cyclohexanone, dichlorobenzene, ethyl lactate, heptanone, mineral spirits, mesitylene, methyl cellusolve acetate, methyl isobutyl ketone, n-methyl pyrolidinone, propylene glycol monomethyl ether acetate, and xylene.

The phase behavior or ternary systems of carbon dioxide and the solubilities of a large number of compounds in liquid carbon dioxide and supercritical carbon dioxide have been much studied since 1954. Carbon dioxide is not a very good solvent for high molecular weight and polar compounds (with some exceptions as noted previously). To increase the solubility of such compounds in liquid or supercritical carbon dioxide (and subcritical and near supercritical carbon dioxide), small amounts (e.g. less than 50 mol %, preferably from 0 to 25% mol %) of polar or non-polar cosolvents can be added. These cosolvents can be used themselves as the supercritical fluid, however, more environmentally friendly substances such as water, carbon dioxide and nitrous oxide are preferred as the supercritical fluid, with the cosolvent used being a minor mol %. Cosolvents such as methane, ethane, propane, butane, etc., and methanol, ethanol, propanol, butanol, etc., as well as methylene, ethylene, propylene, butylene, etc., as well as lower hazard organic co-solvents such as methylene carbonate, ethylene carbonate, propylene carbonate, etc. as well as the chlorides of methylene, ethylene, propylene, etc. can be used. Other possible cosolvents include hexanoic acid, octanoic acid, decanoic acid, pentanoic acid, heptanoic acid, furfural, trioctylamine, isopropylamine, trioctylphosphine oxide, 2-ethyl hexanol, n-butanol, n-amyl alcohol, t-amyl alcohol, decyl alcohol, and mixtures thereof.

Many other solvents can be used for both depositing the organic sacrificial layer and removing the organic sacrificial layer (as a supercritical fluid or preferably mixed with a supercritical fluid such as carbon dioxide, water, or nitrous oxide. Examples include ethyl acetate, propionitrile, toluene, xylene, tetramethylene sulfone, cellosolve acetate. More particularly, suitable solvents which may be utilized include ketones such as acetone, methyl ethyl ketone, methyl isobutyl ketone, mesityl oxide, methyl amyl ketone, cyclohexanone and other aliphatic ketones; esters such as methyl acetate, ethyl acetate, alkyl polycarboxylic acid esters; ethers such as methyl t-butyl ether, dibutyl ether, methyl phenyl ether and other aliphatic or alkyl aromatic ethers; glycol ethers such as ethoxy ethanol, butoxy ethanol, ethoxy 2-propanol, propoxy ethanol, butoxy propanol and other glycol ethers; glycol ether esters such as butoxy ethoxy acetate, ethyl 3-ethoxy propionate and other glycol ether esters; alcohols such as methanol, ethanol, propanol, iso-propanol, butanol, iso-butanol, amyl alcohol and other aliphatic alcohols; aromatic hydrocarbons such as toluene, xylene, and other aromatics or mixtures of aromatic solvents; aliphatic hydrocarbons such as VM&P naphtha and mineral spirits, and other aliphatics or mixtures of aliphatics; nitro alkanes such as 2-nitropropane. A review of the structural relationships important to the choice of solvent or solvent blend is given by Dileep et al., Ind. Eng. Chem. (Product Research and Development) 24, p. 162 (1985) and Francis, A. W., J. Phys. Chem. 58, p. 1099 (1954).

If the organic sacrificial layer is an off-the-shelf photoresist, than the corresponding commercial developer can be used (mixed with the supercritical fluid). Well-known solvents used to dissolve acid sensitve photoresist include ethers, glycol ethers, aromatic hydrocarbons, ketones, esters and the like. One example of an ester that could be used as the solvent is ethyl lactate, whereas one example of a specific glycol ether being propylene glycol monomethyl-ether acetate (PGMEA). If the organic sacrificial layer is comprised of a novolac or novolac-DNQ resin, then an aqueous alkaline solvent such as a metal hydroxide (KOH, NaOH) could be used. Preferably, however, the solvent is an organic non-metal solvent such as tetramethyl ammonium hydroxide (TMAH).

In one embodiment, the cosolvent used with the supercritical fluid, or used as the supercritical fluid itself, is a fluorinated solvent or a siloxane or siloxane modified solvent. Preferably the fluorinated solvent has low viscosity, low cohesive energy density and low suface tension. Fluorinated solvents that can be used alone or as cosolvents, include hydrofluoroethers, highly fluorinated hydrocarbons, and perfluorohexane. In another embodiment, the cosolvent is a gas used for silicon etching, such as SF6 or CHF3.

The apparatus for removing the sacrificial layer (and optionally patterning the sacrificial layer and treating for stiction) can be similar to the Los Alamos SCORR (Supercritical Carbon diOxide Resist Remover) or GT Equipment's Supercritical CO2 MEMS Dryer, such as disclosed in U.S. Pat. No. 6,067,728, incorporated herein by reference. By changing operating parameters, the apparatus can be switched between liquid and supercritical carbon dioxide, thus allowing for deposition and removal of organic material in the same machine. Preferred is an apparatus that allows turbulent yet uniform flow through the reaction chamber, and an apparatus with a closed loop system for recirculating carbon dioxide and cosolvent but separating out waste.

Assembly:

Releasing immediately prior to the application of epoxy or other bonding is preferable (though an anti-stiction treatment or other passivation treatment (or treatment for improving epoxy bond strength) between release and bonding may be desirable). After releasing the micromechanical structures, the remainder of the device can be treated for stiction by applying an anti-stiction layer (e.g. a self assembled monolayer). The layer is preferably formed by placing the device in a liquid or gas silane, preferably a halosilane, and most preferably a chlorosilane. Of course, many different silanes and other materials are known in the art for their ability to provide anti-stiction for MEMS structures. The anti-stiction material can be appllied with standard processes, or even with a compressed fluid (e.g. supercritical nitrous oxide or carbon dioxide).

After releasing the micromechanical structure(s), the first wafer with such structures thereon can be packaged (e.g. if circuitry is provided on the first wafer), or the first wafer can be bonded to another wafer having circuitry thereon, in a "flip-chip" type of assembly. The bonding of the circuitry wafer to the first wafer holding the microstructures can be by anodic bonding, metal eutectic bonding, fusion bonding, epoxy bonding, or other wafer bonding processes known in the art. A preferred bonding method is bonding with an IR or UV epoxy such as disclosed in U.S. Pat. No. 5,963,289 to Stefanov et al, "Asymmetrical Scribe and Separation Method of Manufacturing Liquid Crystal Devices on Silicon Wafers", which is hereby incorporated by reference. In order to maintain separation between the bonded wafers, spacers can be mixed into the epoxy. The spacers can be in the form of spheres or rods and can be dispensed and dispersed between the first wafer and sealing wafer in order to keep the sealing wafer spaced away from the first wafer (so as to avoid damage to the microstructures on the first wafer). Spacers can be dispensed in the gasket area of the display and therefore mixed into the gasket seal material prior to seal dispensing. This is achieved through normal agitated mixing processes. The final target for the gap between the first wafer and sealing wafer can be from 1 to 100 um. This of course depends upon the type of MEMS structure being encapsulated and whether it was surface or bulk micromachined (bulk micromachined structures may not need any spacers between the two wafers). The spheres or rods can be made of glass or plastic, preferably an elastically deforming material. Alternatively, spacer pillars can be microfabricated on at least one of the wafer substrates. In one embodiment, pillars/spacers are provided only at the edge of the array. In another embodiment, pillars/spacers can be fabricated in the array itself. If the spacers are micro-fabricated spacers, they can be formed on the lower wafer, followed by the dispensing of an epoxy, polymer, or other adhesive (e.g. a multi-part epoxy, or a heat or UV-cured adhesive) adjacent to the micro-fabricated spacers. The adhesive and spacers need not be co-located, but could be deposited in different areas on the lower substrate wafer. Alternative to glue, a compression bond material could be used that would allow for adhesion of the upper and lower wafers. Spacers micro-fabricated on the lower wafer (or the upper wafer) and could be made of polyimide, SU-8 photo-resist.

Then, the two wafers are aligned. If precision alignment is desired, alignment of the opposing electrodes or active viewing areas may involve registration of substrate fiducials on opposite substrates. This task accomplished with the aid of video cameras with lens magnification. The machines range in complexity from manual to fully automated with pattern recognition capability. Whatever the level of sophistication, they accomplish the following process: 1. Dispense a very small amount of a UV curable adhesive at locations near the perimeter and off of all functional devices in the array; 2. Align the fiducials of the opposing substrates within the equipment capability; and 3. Press substrates and UV tack for fixing the wafer to wafer alignment through the remaining bonding process (e.g., curing of the internal epoxy).

The final cell gap can be set by pressing the previously tacked laminates in a UV or thermal press. In a UV press, a common procedure would have the substrates loaded into a press where at least one or both of the press platens are quartz, in order to allow UV radiation from a UV lamp to pass unabated to the gasket seal epoxy. Exposure time and flux rates are process parameters determined by the equipment and adhesive materials. Thermally cured epoxies may require that the top and bottom platens of a thermal press be heated. The force that can be generated between the press platens is typically many pounds. With thermally cured epoxies, after the initial press the arrays are typically transferred to a stacked press fixture where they can continue to be pressed and post-cured. In one embodiment, the epoxy between the first wafer and sealing wafer is only partially cured so as to allow easier removal of the sealing wafer. After the sealing wafer is removed, this epoxy can be optionally cured. An epoxy can be selected that adheres less well (depending upon the wafer materials) than other epoxies, so as to allow for easier removal of the sealing wafer after singulation. Also, UV epoxy and IR epoxy can be used at the same time, with the UV epoxy being cured prior to IR cure.

Once the wafers have been bonded together to form a wafer assembly, the assembly can be separated into individual dies. Scribes are placed on the respective substrates in an offset relationship at least along one direction. The units are then separated, resulting in each unit having a ledge on each end of the die. Such a ledge can also allow for electrical testing of each die, as electrical contacts can be exposed on the ledge (e.g., if circuitry has been formed together with the microstructures on the first wafer). The parts can then be separated from the array by venting the scribes on both substrates. Automatic breaking can be done by commercially available guillotine or fulcrum breaking machines. The parts can also be separated by hand.

Separation may also by done by glass scribing and partial sawing of one or both substrates. Sawing is preferably done in the presence of a high-pressure jet of water. Moisture must not be allowed to contact the microstructures. Therefore, at gasket dispense, an additional gasket bead must be dispensed around the perimeter of the wafer, or each gasket bead around each die must fully enclose the die area so that water can not enter and touch the microstructures. Preferably, however, the end of each scribe/saw lane must be initially left open, to let air vent during the align and press processes. After the array has been pressed and the gasket material fully or partially cured, the vents are then closed using either the gasket or end-seal material. The glass is then scribed and sawed.

Alternatively, both the first wafer and sealing wafer substrates may be partially sawed prior to part separation. With the same gasket seal configuration, vent and seal processes as described above, saw lanes are aligned to fiducials on the sealing substrate. The glass is sawed to a depth between 25% and 95% of its thickness. The first wafer substrate is sawed and the parts separated as described above.

The first wafer, upon which the micromechanical structures are formed and released, can be any suitable substrate for the particular MEMS microstructure (and optionally circuitry) formed thereon, such as a light transmissive substrate such as glass, borosilicate, tempered glass, quartz or sapphire, or any other suitable light transmissive material. Or, the first wafer could be a metal, ceramic or preferably a semiconductor wafer (e.g. silicon or GaAs).

It should be noted that the invention is applicable to forming micromirrors such as for a projection display or optical switch, or any other MEMS. If an optical switch is the microstructure being protected, mirrors with multiple hinges can be provided on the first wafer so as to allow for multi-axis movement of the mirror. Such multi-axis movement, mirrors for achieving such movement, and methods for making such mirrors are disclosed in U.S. patent application Ser. No. 09/617,149 to Huibers et al., the subject matter of which is incorporated herein by reference.

Of course, the microstructure need not be a movable mirror (for a projection display, for optical switching, or even for data storage), but could be one or more accelerometers, DC relay or RF switches, microlenses, beam splitters, filters, oscillators and antenna system components, variable capacitors and inductors, switched banks of filters, resonant comb-drives and resonant beams, etc. Any MEMS structure, particularly a released or movable structure, could benefit from the release method described herein.

It should also be noted that the novel materials used for the sacrificial material can be removed by downstream oxygen plasma release, or with a liquid solvent (flow the liquid solvent across the MEMS structure/array to remove the organic sacrificial material, followed by flowing an alcohol, freezing the alcohol, and sublimating off the alcohol to release the MEMS structures), or by other methods for removing organic materials.

The invention has been described in terms of specific embodiments. Nevertheless, persons familiar with the field will appreciate that many variations exist in light of the embodiments described herein.

We claim:

1. A method comprising:
    depositing an organic material on a substrate;
    depositing additional material different from said organic material after depositing the organic material; and
    removing the organic material with a compressed fluid;
    wherein the released and movable additional material forms a micromirror for a display system or optical switch.
2. The method of claim 1, wherein the organic material is deposited as a sacrificial layer in a MEMS process.
3. The method of claim 1, wherein by removing the organic material, the additional material is released and is capable of movement.
4. The method of claim 1, wherein the organic material is a polymer.
5. The method of claim 4, wherein the polymer is an alkyd, acrylic, epoxy, polyxylylene, polyvinyl, polyurethane, fluorocarbon, phenolic, polyimide or silicone.
6. The method of claim 1, wherein the organic material is a photoresist.
7. The method of claim 6, wherein the photoresist is based on a cyclized rubber, novolac, hydroxystyrene, cyclic olefin, acrylate, or fluorocarbon.
8. The method of claim 6, wherein the photoresist is light sensitive.
9. The method of claim 1, wherein the organic material comprises a fluorocarbon or silicone.
10. The method of claim 1, wherein the organic material is patterned prior to depositing the additional material.
11. The method of claim 1, wherein the organic material is deposited by spin coating or chemical vapor deposition.
12. The method of claim 10, wherein the patterning comprises directing light of a particular wavelength at the organic material and removing portions of the organic material.
13. The method of claim 1, wherein the organic material is a spin-on low-k organic material.
14. The method of claim 1, wherein the organic material is deposited by mixing an organic precursor material with a solvent or liquid carbon dioxide, and providing the mixture onto a substrate.
15. The method of claim 1, wherein the compressed fluid is a supercritical alkane, alkene or alcohol.
16. The method of claim 1, wherein the organic material is removed with a supercritical fluid and a cosolvent.
17. The method of claim 1, wherein the organic material is removed with supercritical carbon dioxide and an aromatic organic cosolvent.
18. The method of claim 17, wherein the compressed fluid is a supercritical fluid, near-critical fluid, expanded liquid or highly compressed gas.
19. The method of claim 18, wherein the fluid is carbon dioxide.
20. The method of claim 18, wherein the fluid is water or nitrous oxide.
21. The method of claim 16, wherein the cosolvent is an organic solvent.
22. The method of claim 16, wherein the cosolvent is an ether, glycol ether, aromatic hydrocarbon, ketone or ester.
23. The method of claim 1, wherein the additional material comprises silicon or a silicon compound.
24. The method of claim 1, wherein the additional material comprises a metal.
25. The method of claim 1, wherein the additional material is a plurality of layers.
26. The method of claim 25, wherein one of the layers comprises silicon nitride.
27. The method of claim 1, further comprising providing a stiction reducing agent after removing the organic material.
28. The method of claim 27, wherein the stiction reducing agent is a silane or siloxane.
29. The method of claim 28, wherein the stiction reducing agent is a chlorosilane.
30. A method comprising:
    providing an organic layer on a substrate;
    after providing the organic layer, providing one or more layers of a material different than the organic material of the organic layer;
    removing the organic layer with a compressed fluid; and
    providing an anti-stiction agent to material remaining after removal of the organic layer with a compressed fluid.
31. The method of claim 30, wherein the compressed fluid is the same for removing the organic layer as for providing the anti-stiction agent.
32. The method of claim 30, wherein the compressed fluid is a near critical or supercritical fluid.
33. The method of claim 32, wherein the fluid is supercritical carbon dioxide, water or nitrous oxide.
34. The method of claim 30, further comprising providing a compressed fluid for cleaning after removal of the organic material but before providing the anti-stiction agent.
35. The method of claim 34, wherein supercritical carbon dioxide is used for removal of the organic material, cleaning and providing the anti-stiction agent.
36. The method of claim 35, wherein the supercritical carbon dioxide is provided continuously or substantially continuously from the beginning of removing the organic material to the end of providing the anti-stiction agent.
37. The method of claim 30, wherein the organic material is deposited as a sacrificial layer in a MEMS process.
38. The method of claim 30, wherein by removing the organic material, the additional one or more layers are released and capable of movement.
39. The method of claim 38, wherein the released and movable one or more layers forms a micromirror for a display or optical switch.
40. The method of claim 38, wherein the released and movable one or more layers forms an accelerometer, DC relay, RF switch, filter, oscillator, variable capacitors or inductor.
41. The method of claim 30, wherein the organic material is a polymer.
42. The method of claim 41, wherein the polymer is an alkyd, acrylic, epoxy, polyxylylene, polyvinyl, polyurethane, fluorocarbon, phenolic, polyimide or silicone.
43. The method of claim 30, wherein the organic material is a photoresist.

44. The method of claim 43, wherein the photoresist is based on a cyclized rubber, novolac, hydroxystyrene, cyclic olefin, acrylate, or fluorocarbon.

45. The method of claim 43, wherein the photoresist is light sensitive.

46. The method of claim 30, wherein the organic material comprises a fluorocarbon or silicone.

47. The method of claim 30, wherein the organic material is patterned prior to depositing the additional material.

48. The method of claim 30, wherein the organic material is deposited by spin coating or chemical vapor deposition.

49. The method of claim 47, wherein the patterning comprises directing light of a particular wavelength at the organic material and removing portions of the organic material.

50. The method of claim 30, wherein the organic material is a spin-on low-k organic material.

51. The method of claim 30, wherein the organic material is deposited by mixing an organic precursor material with a solvent or liquid carbon dioxide, and providing the mixture onto a substrate.

52. The method of claim 30, wherein the compressed fluid is a supercritical alkane, alkene or alcohol.

53. The method of claim 30, wherein the organic material is removed with a supercritical fluid and a cosolvent.

54. The method of claim 30, wherein the organic material is removed with supercritical carbon dioxide and an aromatic organic cosolvent.

55. The method of claim 54, wherein the compressed fluid is a supercritical fluid, near-critical fluid, expanded liquid or highly compressed gas.

56. The method of claim 55, wherein the fluid is carbon dioxide.

57. The method of claim 55, wherein the fluid is water or nitrous oxide.

58. The method of claim 53, wherein the cosolvent is an organic solvent.

59. The method of claim 53, wherein the cosolvent is an ether, glycol ether, aromatic hydrocarbon, ketone or ester.

60. The method of claim 30, wherein the additional material comprises silicon or a silicon compound.

61. The method of claim 30, wherein the additional material comprises a metal.

62. The method of claim 30, wherein the additional material is a plurality of layers.

63. The method of claim 62, wherein one of the layers comprises silicon nitride.

64. The method of claim 30, further comprising providing a stiction reducing agent after removing the organic material.

65. The method of claim 64, wherein the stiction reducing agent is a silane or siloxane.

66. The method of claim 65, wherein the stiction reducing agent is a chlorosilane.

67. A method for making a micromirror array, comprising:
depositing and patterning an organic material on a substrate;
depositing additional material different from said organic material after depositing the organic material;
patterning said additional material to define a plurality of micromirror elements; and
removing the organic material with a compressed fluid.

68. A method comprising:
depositing an organic material on a substrate;
depositing additional material different from said organic material after depositing the organic material; and
removing the organic material, with a compressed fluid;
wherein the released and movable additional material forms an accelerometer, DC relay, RF switch, filter, oscillator, variable capacitor, or inductor.

69. The method of claim 68, wherein by removing the organic material, the additional material is released and is capable of movement.

70. The method of claim 68, wherein the organic material is a polymer.

71. method of claim 70, wherein the polymer is an alkyd, acrylic, epoxy, polyxylyjene, polyvinyl, polyurethane, fluorocarbon, phenolic, polyimide or silicone.

72. The method of claim 68, wherein the organic material is a photoresist.

73. The method of claim 72, wherein the photoresist is based on a cyclized rubber, novolac, hydroxystyrene, cyclic olefin, acrylate, or fluorocarbon.

74. The method of claim 72, wherein the photoresist is light sensitive.

75. The method of claim 68, wherein the organic material is deposited by spin coating or chemical vapor deposition.

76. The method of claim 68, wherein the organic material is a spin-on low-k organic material.

77. The method of claim 68, wherein the organic material is deposited by mixing an organic precursor material with a solvent or liquid carbon dioxide, and providing the mixture onto a substrate.

78. The method of claim 68, wherein the organic material is removed with a supercritical fluid and a cosolvent.

79. The method of claim 68, wherein the organic material is removed with supercritical carbon dioxide and an aromatic organic cosolvent.

80. The method of claim 79, wherein the compressed fluid is a supercritical fluid, near-critical fluid, expanded liquid or highly compressed gas.

81. The method of claim 80, wherein the fluid is carbon dioxide.

82. A method comprising:
depositing an organic material on a substrate;
depositing additional material different from said organic material after depositing the organic material;
removing the organic material with a compressed fluid;
wherein the organic material comprises a fluorocarbon or silicone; and
wherein by removing the organic material, the additional material is released and is capable of movement.

83. The method of claim 82, wherein the organic material is a polymer.

84. The method of claim 83, the polymer is an alkyd, acrylic, epoxy, polyxylylene, polyvinyl, polyurethane, fluorocarbon, phenolic, polyimide or silicone.

85. The method of claim 82, wherein the organic material is a photoresist.

86. The method of claim 85, wherein the photoresist is based on a cyclized rubber, novolac, hydroxystyrene, cyclic olefin, acrylate, or fluorocarbon.

87. The method of claim 85, wherein the photoresist is light sensitive.

88. The method of claim 82, wherein the organic material is deposited by spin coating or chemical vapor deposition.

89. The method of claim 82, wherein the organic material is a spin-on low-k organic material.

90. The method of claim 82, wherein the organic material is deposited by mixing an organic precursor material with a solvent or liquid carbon dioxide, and providing the mixture onto a substrate.

91. The method of claim 82, wherein the organic material is removed with a supercritical fluid and a cosolvent.

92. The method of claim 82, wherein the organic material is removed with supercritical carbon dioxide and an aromatic organic cosolvent.

93. The method of claim 92, wherein the compressed fluid is a supercritical fluid, near-critical fluid, expanded liquid or highly compressed gas.

94. The method of claim 93, wherein the fluid is carbon dioxide.

95. A method comprising:

depositing an organic material on a substrate;

depositing additional material different from said organic material after depositing the organic material; and removing the organic material with a compressed fluid;

wherein the additional material comprises silicon or a silicon compound.

96. The method of claim 95, wherein by removing the organic material, the additional material is released and is capable of movement.

97. The method of claim 95, wherein the organic material is a polymer.

98. The method of claim 97, wherein the polymer is an alkyd, acrylic, epoxy, polyxylylene, polyvinyl, polyurethane, fluorocarbon, phenolic, polyimide or silicone.

99. The method of claim 95, wherein the organic material is a photoresist.

100. The method of claim 99, wherein the photoresist is based on a cyclized rubber, novolac, hydroxystyrene, cyclic olefin, acrylate, or fluorocarbon.

101. The method of claim 99, wherein the photoresist is light sensitive.

102. The method of claim 95, wherein the organic material is deposited by spin coating or chemical vapor deposition.

103. The method of claim 95, wherein the organic material is a spin-on low-k organic material.

104. The method of claim 95, wherein the organic material is deposited by mixing an organic precursor material with a solvent or liquid carbon dioxide, and providing the mixture onto a substrate.

105. The method of claim 95, wherein the organic material is removed with a supercritical fluid and a cosolvent.

106. The method of claim 95, wherein the organic material is removed with supercritical carbon dioxide and an aromatic organic cosolvent.

107. The method of claim 96, wherein the compressed fluid is a supercritical fluid, near-critical fluid, expanded liquid or highly compressed gas.

108. The method of claim 107, wherein the fluid is carbon dioxide.

109. A method comprising:

depositing an organic material on a substrate;

depositing additional material different from said organic material after depositing the organic material; and removing the organic material with a compressed fluid;

wherein the additional material is a plurality of layers.

110. The method of claim 109, wherein by removing the organic material, the additional material is released and is capable of movement.

111. The method of claim 109, wherein the organic material is a polymer.

112. The method of claim 111, wherein the polymer is an alkyd, acrylic, epoxy, polyxylylene, polyvinyl, polyurethane, fluorocarbon, phenolic, polyimide or silicone.

113. The method of claim 109, wherein the organic material is a photoresist.

114. The method of claim 113, wherein the photoresist is based on a cyclized rubber, novolac, hydroxystyrene, cyclic olefin, acrylate, or fluorocarbon.

115. The method of claim 113, wherein the photoresist is light sensitive.

116. The method of claim 109, wherein the organic material is deposited by spin coating or chemical vapor deposition.

117. The method of claim 109, wherein the organic material is a spin-on low-k organic material.

118. The method of claim 109, wherein the organic material is deposited by mixing an organic precursor material with a solvent or liquid carbon dioxide, and providing the mixture onto a substrate.

119. The method of claim 109, wherein the organic material is removed with supercritical fluid and a cosolvent.

120. The method of claim 109, wherein the organic material is removed with supercritical carbon dioxide and an aromatic organic cosolvent.

121. The method of claim 110, wherein the compressed fluid is a supercritical fluid, near-critical fluid, expanded liquid or highly compressed gas.

122. The method of claim 121, wherein the fluid is carbon dioxide.

* * * * *